1/15/85 XR 4,494,032

United States Patent [19]
Martin
[11] Patent Number: 4,494,032
[45] Date of Patent: Jan. 15, 1985

[54] TRANSDUCER PLATE FOR ELECTRO-ACOUSTIC TRANSDUCERS

[75] Inventor: Erwin Martin, Munich, Fed. Rep. of Germany
[73] Assignee: Siemens Aktiengesellschaft, Berlin and Munich, Fed. Rep. of Germany

[21] Appl. No.: 524,267
[22] Filed: Aug. 18, 1983
[30] Foreign Application Priority Data
Aug. 30, 1982 [DE] Fed. Rep. of Germany ....... 3232177
[51] Int. Cl.[3] ........................ H01L 41/08
[52] U.S. Cl. ........................ 310/324; 310/322; 179/110 A
[58] Field of Search ........................ 310/324, 322; 179/110 A; 340/384 E, 388, 397

[56] References Cited

U.S. PATENT DOCUMENTS

| | | | |
|---|---|---|---|
| 3,708,702 | 1/1973 | Brunnert et al. | 310/8.2 |
| 3,761,956 | 9/1973 | Takahashi et al. | 310/324 |
| 3,970,879 | 7/1976 | Kumon | 310/324 |
| 4,156,156 | 5/1979 | Sweany et al. | 310/324 X |
| 4,190,782 | 2/1980 | Guess | 310/324 |
| 4,368,401 | 1/1983 | Martin et al. | 310/324 |
| 4,376,232 | 3/1983 | Martin | 179/110 A |

FOREIGN PATENT DOCUMENTS

| | | |
|---|---|---|
| 8090882 | 2/1981 | Australia . |
| 8090982 | 2/1981 | Australia . |

*Primary Examiner*—Mark O. Budd
*Att·rney, Agent, or Firm*—Mark H. Jay

[57] ABSTRACT

The invention relates to a transducer plate for electro-acoustic transducers, such as used in telecommunications technology, having a carrier plate and a ceramic plate arranged on a carrier plate. The invention teaches a transducer plate which is dimensioned so that it can be used in a microphone, a receiver or a piezoelectric VF ringing device despite the different voltage response factors required for each application. The following dimensions should preferably be used: transducer plate diameter ($0_2$)=43 mm; ceramic plate diameter ($0_1$)=30 mm; transducer plate thickness (d)=150 microns; and ceramic plate thickness (1)=90 microns.

6 Claims, 2 Drawing Figures

TRANSDUCER PLATE FOR ELECTRO-ACOUSTIC TRANSDUCERS

BACKGROUND OF THE INVENTION

The invention relates to a transducer plate for electro-acoustic transducers, which utilizes a piezoelectric ceramic coating.

Existing transducer plates are disclosed by German patent No. 1,961,217 and by the following published German patent applications: No. 3,107,344, No. 3,107,293, No. 3,007,834; No. 3,005,708 and No. 3,007,808. These references disclose a transducer element which is clamped between bearing bodies.

Piezoelectric transducers belong to the category of reversible transducers, which can emit sound when electrically excited or produce electricity when excited by sound energy. Accordingly, these transducers can be used in many applications, such as microphones, earphones or VF ringing devices in telephone systems. Depending upon the use, the transducer must be specially adapted to the requirements of that application. In some circumstances it is necessary to provide an amplifier, while in other applications resonator cavities and sound guidance channels must be specially matched to the particular type of transducer being used.

To be economical it is desirable to utilize the least number of components for the various types of transducer applications.

SUMMARY OF THE INVENTION

The object of the invention is to provide a transducer plate which can be used for various telecommunication functions so that the cost of the transducer and the total number of transducers that must be maintained as replacements is reduced.

In general, the invention features a transducer plate, provided with a piezoelectric ceramic coating, for electro-acoustic transducers, in which the diameter of the transducer plate is between 40 and 45 mm, the diameter of the ceramic is between 25 and 35 mm, the thickness of the transducer plate is between 100 and 250 microns, and the thickness of the ceramic is between 50 and 150 microns.

In preferred embodiments the transducer plate has a diameter

- substantially equal to 43 mm; the ceramic has a diameter
- substantially equal to 30 mm; the transducer plate has a thickness
- substantially equal to 150 microns; the ceramic has a thickness
- substantially equal to 90 microns; the thickness of the ceramic is approximately 100 microns and dielectric constant of the ceramic is greater than or equal to 3000.

Other features and advantages of the invention will be apparent from the following detailed description, and from the claims.

For a full understanding of the present invention, reference should now be made to the following detailed description and to the accompanying drawings.

BRIEF DESCRIPTION OF THE DRAWINGS

The invention will be described in detail with reference to the following drawings.

DETAILED DESCRIPTION

Figure 1:
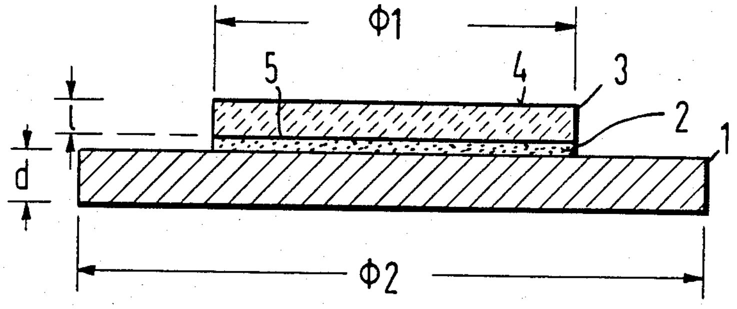
FIG. 1 is a cross-section of a transducer plate.
Figure 2:
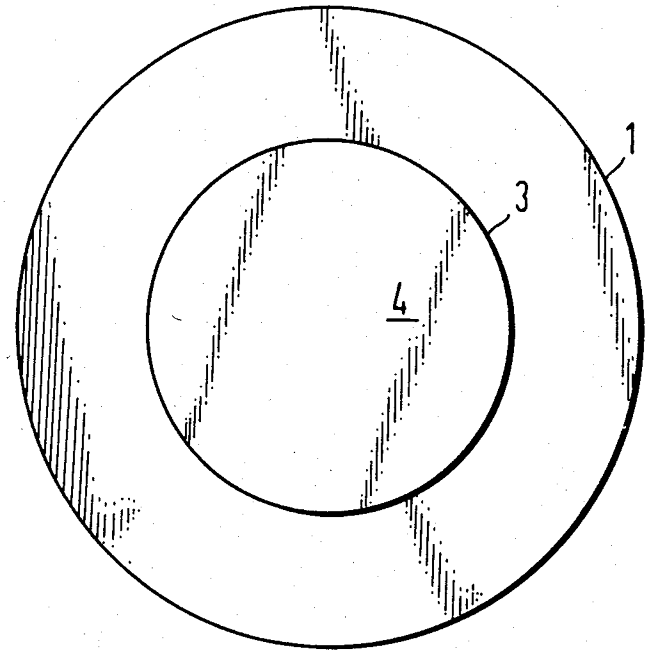
FIG. 2 is a plan view of the transducer plate shown in FIG. 1.

Transducer plate 4, shown in in the FIGS. 1 and 2, consists of carrier plate 1, composed of an aluminum alloy or brass, and piezo-ceramic plate 3, which is connected to carrier plate 1 at interface 5, by adhesive layer 2. The adhesive layer can consist of a relatively thick layer which is distributed over the entire surface of the carrier plate. In the following embodiment, however, adhesive layer 2 consists of a relatively thin coating which is only applied beneath the ceramic plate and which possesses a negligible thickness.

The following dimensions are for a transducer element formed in accordance with the invention:

| | |
|---|---|
| Diameter of piezoelectric plate 3 | $\phi_1$ = 25–35 mm |
| Diameter of carrier plate 1 | $\phi_2$ = 40–45 mm |
| Thickness of ceramic plate 3 | 1 = 50–150 microns |
| Thickness of carrier plate 1 | d = 100–250 microns |

The dimension restrictions are determined by the high voltage response factor required for sound transmitters, by the ability to process the plates to certain thicknesses and diameters, and by the frequency response characteristics. Therefore, the thickness of both the ceramic and the transducer plate cannot fall below a minimum value. In addition, upper dimension limits also exist. The maximum diameter of the ceramic is determined by the manufacturing limitations imposed by the facility which produces the thin ceramic plates. The diameter of the carrier plate is only limited by the maximum possible capsule diameter.

When the transducer is utilized as a receiver in a telephone a transducer capacitance of at least 200 nF is necessary to attain the requisite voltage response factor so that the receiver is matched to the telephone circuit. This can be achieved by using a very thin ceramic plate and an average dielectric constant.

However, to use the same transducer element for other applications in accordance with the object of the invention, it is desirable to select an average ceramic thickness of approximately 100 microns and a dielectric constant for the ceramic of greater than or equal to 3000. This allows the transducer to be used for all applications.

Therefore, the present invention teaches a single transducer plate which can be used successfully in a microphone, a receiver and for a VF ringing device, despite the different voltage response factors required for each application.

There has thus been shown and described a novel apparatus for a transducer plate for electro-acoustic transducers which fulfills all the objects and advantages sought. Many changes, modifications, variations and other uses and applications of the subject invention will, however, become apparent to those skilled in the art after considering this specification and the accompanying drawings which disclose embodiments thereof. All such changes, modifications, variations and other uses and applications which do not depart from the spirit and scope of the invention are deemed to be covered by the invention which is limited only by the claims which follow.

What is claimed is:

1. In a transducer plate for electro-acoustic transducers for telephone apparatus formed by a piezoelectric ceramic layer provided with electrodes on both sides and connected with a support plate, the improvement wherein the transducer plate required for a microphone, a receiver or tone ringer has a transducer plate diameter between 40 and 45 mm, a ceramic diameter between 25 and 35 mm, a transducer plate thickness between 100 and 250 microns, and a ceramic thickness between 50 and 150 microns.

2. The improvement of claim 1, wherein the transducer plate has a diameter substantially equal to 43 mm.

3. The improvement of claim 1, wherein the ceramic has a diameter substantially equal to 30 mm.

4. The improvement of claim 1, wherein the transducer plate has a thickness substantially equal to 150 microns.

5. The improvement of claim 1, wherein the ceramic has a thickness substantially equal to 90 microns.

6. The improvement of claim 1, wherein the thickness of the ceramic is approximately 100 microns and the dielectric constant of the ceramic is greater than or equal to 3000.

* * * * *